(12) United States Patent
Di et al.

(10) Patent No.: US 12,349,463 B2
(45) Date of Patent: Jul. 1, 2025

(54) DISPLAY PANEL, MANUFACTURING METHOD THEREOF, AND DISPLAY DEVICE

(71) Applicant: BOE Technology Group Co., Ltd., Beijing (CN)

(72) Inventors: Muxin Di, Beijing (CN); Zhiwei Liang, Beijing (CN); Yingwei Liu, Beijing (CN); Ke Wang, Beijing (CN); Zhanfeng Cao, Beijing (CN); Guangcai Yuan, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 902 days.

(21) Appl. No.: 17/265,228

(22) PCT Filed: May 19, 2020

(86) PCT No.: PCT/CN2020/091119
§ 371 (c)(1),
(2) Date: Feb. 2, 2021

(87) PCT Pub. No.: WO2020/233576
PCT Pub. Date: Nov. 26, 2020

(65) Prior Publication Data
US 2021/0305283 A1    Sep. 30, 2021

(30) Foreign Application Priority Data

May 21, 2019   (CN) .......................... 201910422202.8

(51) Int. Cl.
*H10D 86/60*    (2025.01)
*H01L 23/498*   (2006.01)
(Continued)

(52) U.S. Cl.
CPC ......... *H10D 86/60* (2025.01); *H01L 23/4985* (2013.01); *H01L 25/0753* (2013.01);
(Continued)

(58) Field of Classification Search
CPC ............... H01L 27/1218; H01L 27/124; H01L 27/1248; H01L 27/1214; H01L 27/1266;
(Continued)

(56) References Cited

U.S. PATENT DOCUMENTS

2014/0375916 A1   12/2014   Chen et al.
2017/0047389 A1   2/2017    Akimoto et al.
(Continued)

FOREIGN PATENT DOCUMENTS

| CN | 103413820 A | 11/2013 |
| CN | 107256870 A | 10/2017 |

(Continued)

OTHER PUBLICATIONS

Chinese Office Action for corresponding 201910422202.8 issued Dec. 3, 2020.

*Primary Examiner* — Natalia A Gondarenko
(74) *Attorney, Agent, or Firm* — ArentFox Schiff LLP; Michael Fainberg (57) ABSTRACT

A display panel, a manufacturing method thereof, and a display device. The manufacturing method comprises: sequentially forming a sacrificial layer and a flexible substrate on a surface of a side of a rigid base plate; forming a connection-via pair in the flexible substrate; forming a conductive layer on the flexible substrate, and forming connection portions; forming a leveling layer; forming driving circuits corresponding one-to-one to the connection-via pairs on the flexible substrate, and forming a driving chip on a side of the driving circuits facing away from the flexible substrate, the driving chip being electrically connected to the driving circuits; separating the sacrificial layer from the flexible substrate; and forming a micro LED device on a
(Continued)

surface of the flexible substrate facing away from the driving circuits, the micro LED device being electrically connected to the connection portions.

20 Claims, 9 Drawing Sheets

(51) Int. Cl.
    *H01L 25/075*     (2006.01)
    *H10D 30/67*     (2025.01)
    *H10D 86/01*     (2025.01)
    *H10D 86/40*     (2025.01)
    *H10H 20/01*     (2025.01)
    *H10H 20/857*     (2025.01)

(52) U.S. Cl.
    CPC ..... *H10D 30/6723* (2025.01); *H10D 86/0214* (2025.01); *H10D 86/411* (2025.01); *H10D 86/441* (2025.01); *H10H 20/857* (2025.01); *H10H 20/0364* (2025.01)

(58) Field of Classification Search
    CPC ............... H01L 27/156; H01L 23/4985; H01L 25/0753; H01L 25/167; H01L 29/78633; H01L 33/08; H01L 33/486; H01L 33/502; H01L 33/504; H01L 33/505; H01L 33/54; H01L 33/58; H01L 33/60; H01L 33/62; H01L 2933/0066; G09F 9/301; G09F 9/33; G09G 3/32; H10D 86/0214; H10D 86/411; H10D 86/441; H10D 86/40; H10D 86/60; H10D 30/6723; H10H 20/83–835; H10H 20/857; H10H 20/032; H10H 20/0364; H10H 29/02; H10H 29/032; H10H 29/0364; H10H 29/10; H10H 29/142; H10H 29/20; H10H 29/24; H10H 29/30; H10H 29/39; H10H 29/41; H10H 29/45; H10H 29/49; H10H 29/832; H10H 29/8321
    USPC ................. 257/89, E33.067, E33.06; 438/29
    See application file for complete search history.

(56) References Cited

U.S. PATENT DOCUMENTS

| | | | |
|---|---|---|---|
| 2017/0141091 A1* | 5/2017 | Bibl | ...................... H01L 23/293 |
| 2018/0006058 A1* | 1/2018 | Lee | ...................... H01L 27/1218 |
| 2020/0020272 A1* | 1/2020 | Huang | ................ G02F 1/13452 |
| 2020/0105790 A1 | 4/2020 | Gu et al. | |
| 2020/0111403 A1* | 4/2020 | Kim | ......................... G09G 3/32 |
| 2020/0119244 A1* | 4/2020 | Kwon | ...................... H01L 33/62 |
| 2020/0294978 A1* | 9/2020 | Go | .......................... H01L 24/24 |
| 2021/0202530 A1 | 7/2021 | Yao et al. | |
| 2021/0210522 A1 | 7/2021 | Liu et al. | |

FOREIGN PATENT DOCUMENTS

| | | |
|---|---|---|
| CN | 107887331 A | 4/2018 |
| CN | 109244086 A | 1/2019 |
| CN | 109410775 A | 3/2019 |
| CN | 109585462 A | 4/2019 |
| CN | 110112171 A | 8/2019 |
| KR | 20170133573 A | 12/2017 |

* cited by examiner

DISPLAY PANEL, MANUFACTURING METHOD THEREOF, AND DISPLAY DEVICE

CROSS REFERENCE TO RELATED APPLICATIONS

The disclosure is a National Stage of International Application No. PCT/CN2020/091119, filed on May 19, 2020, which claims priority to China Patent Application No. 201910422202.8, filed to China National Intellectual Property Administration on May 21, 2019, both of which are hereby incorporated by reference in their entirety.

FIELD

The present disclosure relates to the field of display technology, and more particularly relates to a display panel, a manufacturing method thereof, and a display device.

BACKGROUND

A full-screen technology has gradually become a mainstream technology for mobile phones and other handheld devices. At the present, a GOA (Gate Driver On Array) technology is used to realize narrowing of left and right bezels, and a COF (Chip On Film) technology is used to realize narrowing of a lower bezel. However, whether it is GOA or COF, this technology for bonding on a display screen bezel still cannot achieve seamless splicing.

SUMMARY

The embodiments of the present disclosure provide a display panel, including:
- a flexible substrate, including a plurality of connection-via pairs, wherein each of the connection-via pairs includes two connection vias;
- connection portions, located on a side of the flexible substrate and corresponding one-to-one to the connection vias, wherein each of the connection portions includes a first connection end in the corresponding connection via and a second connection end extending to a surface of a side of the flexible substrate, and a thickness of the first connection end is less than a via depth of the corresponding connection via;
- a leveling layer, located on a side of the connection portions away from the flexible substrate;
- driving circuits, located on a side of the leveling layer away from the flexible substrate and corresponding one-to-one to the connection-via pairs, wherein each of the driving circuits is electrically connected to second connection ends of two of the connection portions separately;
- a driving chip, located on a side of the driving circuits away from the flexible substrate, wherein the driving chip is electrically connected to the driving circuits; and
- micro LEDs (light emitting diodes), located on a side of the flexible substrate away from the driving circuits and corresponding one-to-one to the connection-via pairs, wherein each of the micro LEDs is electrically connected to first connection ends of two of the connection portions separately.

Optionally, in the display panel provided by the embodiments of the present disclosure, the driving circuit includes a thin-film transistors and an auxiliary trace:

a drain of each thin-film transistor is electrically connected to the second connection end of one of the two of the connection portions, and a source of the thin-film transistor is electrically connected to the driving chip; and the auxiliary trace is electrically connected to the second connection end of the other of the two of the connection portions.

Optionally, in the display panel provided by the embodiments of the present disclosure, the thin-film transistor includes: a buffer layer, an active layer, a gate insulation layer, a gate, an interlayer dielectric layer, the sources and the drains which are stacked sequentially on the side of the leveling layer away from the flexible substrate:

the source, the drain and the auxiliary trace belong to the same film layer: the drain is electrically connected to the second connection end of one of the two of the connection portions by means of vias penetrating through the interlayer dielectric layer, the gate insulation layer, the buffer layer and the leveling layer, and the auxiliary trace is electrically connected to the second connection end of one of the other of the connection portions by means of vias penetrating through the interlayer dielectric layer, the gate insulation layer, the buffer layer and the leveling layer.

Optionally, in the display panel provided by the embodiments of the present disclosure, the display panel further includes: a planarization layer located between the driving circuits and the driving chip, and a chip bonding pad located between the driving circuits and the planarization layer: wherein the chip bonding pad is connected to the source by means of a welding via penetrating through the planarization layer, and the chip bonding pad is connected to the driving chip and the source, respectively.

Optionally, in the display panel provided by the embodiments of the present disclosure, the display panel further includes: a light shield portion arranged on the same film layer as the connection portions; and an orthographic projection of the active layer on the flexible substrate falls into an orthographic projection of the light shield portion on the flexible substrate.

Optionally, in the display panel provided by the embodiments of the present disclosure, a material of the leveling layer is the same as a material of the flexible substrate.

On another aspect, the embodiments of the present disclosure further provide a manufacturing method for a display panel, including:

forming a sacrificial layer and a flexible substrate sequentially on a surface of a side of a rigid base plate;

forming a plurality of connection-via pairs in the flexible substrate, wherein each of the connection-via pairs includes two connection vias;

depositing a conductive layer on a side of the flexible substrate away from the rigid base plate, and forming connection portions corresponding one-to-one to the connection vias on the conductive layer by means of a patterning process, wherein a pattern of each connection portion includes a first connection end located in the corresponding connection via and a second connection end extending to a surface of a side of the flexible substrate, and a thickness of the first connection end is less than a via depth of the connection via;

forming a leveling layer for filling and leveling up the connection vias on a side of the conductive layer away from the rigid base plate;

forming driving circuits corresponding one-to-one to the connection-via pairs on a side of the leveling layer away from the rigid base plate, wherein each of the driving circuits is electrically connected to second connection ends of two of the connection portions separately;

bonding a driving chip electrically connected to the driving circuits to a side of the driving circuits away from the rigid base plate;

separating the sacrificial layer from the flexible substrate; and fixing micro LEDs electrically connected to first connection ends of the connection portions to a side of the flexible substrate away from the driving circuits.

Optionally, in the manufacturing method provided by the embodiments of the present disclosure, the forming the driving circuits corresponding one-to-one to the connection-via pairs on the side of the leveling layer away from the rigid base plate includes:

stacking a buffer layer, an active layer, a gate insulation layer, a gate and an interlayer dielectric layer sequentially on a side of the leveling layer away from the flexible substrate;

forming vias penetrating through the interlayer dielectric layer, the gate insulation layer, the buffer layer and the leveling layer by means of a patterning process; and forming sources, drains and auxiliary traces on a side of the interlayer dielectric layer away from the flexible substrate, wherein the drains and the auxiliary traces is electrically connected to second connection ends respectively by means of the vias penetrating through the interlayer dielectric layer, the gate insulation layer, the buffer layer and the leveling layer.

Optionally, in the manufacturing method provided by the embodiments of the present disclosure, the bonding the driving chip electrically connected to the driving circuits to the side of the driving circuits away from the rigid base plate specifically includes:

forming a planarization layer on a side of the driving circuits away from the flexible substrate, and forming welding vias penetrating through the planarization layer by means of a patterning process;

forming a chip bonding pad on a side of the planarization layer away from the flexible substrate, wherein the chip bonding pad is electrically connected to the sources by means of the welding vias; and bonding the driving chip on the chip bonding pad.

Optionally, in the manufacturing method provided by the embodiments of the present disclosure, the manufacturing method further includes: forming a light shield portion of which an orthographic projection on the flexible substrate covers the active layer to be formed, while the connection portions corresponding one-to-one to the connection vias are formed on the conductive layer by means of the patterning process.

Optionally, in the manufacturing method provided by the embodiments of the present disclosure, the fixing micro LEDs electrically connected to the first connection ends of the connection portions to the side of the flexible substrate away from the driving circuits includes:

transferring the micro LEDs to a surface of the side of the flexible substrate away from the driving circuits; and bonding the micro LEDs to the first connection ends of the connection portions.

Optionally, in the manufacturing method provided by the embodiments of the present disclosure, the forming the leveling layer for filling and leveling up the connection vias on the side of the conductive layer away from the rigid base plate specifically includes:

forming the leveling layer for filling and leveling up the connection vias on the side of the conductive layer away from the rigid base plate by using a material which is the same as a material of the flexible substrate.

Optionally, in the manufacturing method provided by the embodiments of the present disclosure, the forming a plurality of connection-via pairs in the flexible substrate specifically includes:

forming the plurality of connection-via pairs by performing a dry etching process on the flexible substrate.

On yet another aspect, the embodiments of the present disclosure provide a display device, including a plurality of the above-mentioned display panels, provided by the embodiments of the present disclosure, which are mutually spliced.

DETAILED DESCRIPTION OF THE EMBODIMENTS

At present, in order to realize a full screen, there is a concerned TGV (through glass via) technology, a manufacturing process of which generally includes: perforating a glass backplane at first: then electroplating Cu on two sides of glass by an electroplating process; and then removing the Cu from the two sides of the glass by a chemical-mechanical polishing process to reserve the Cu filled in bores of a rigid base plate. After the TGV backplane is manufactured, a panel manufacturer manufactures a driving backplane of the display panel. The TGV base plate and the driving base plate manufactured based on the TGV base plate face many challenges, among which, the most difficult problem to be solved is that the Cu in the bores of the TGV swells due to a high temperature in the technological process, thus causing wire fracturing of a film layer covering it.

Similarly, polyimide (PI) used as a base plate material of a display device makes it possible to avoid this problem. However, the PI base plate material is thin and too soft, so that after the driving backplane is manufactured on this material, it is greatly difficult for peeling or a welding procedure of a back surface. Therefore, if a material has a glass nature and can also solve the problem of swelling of a metal wire in the bores, this material is of great significance for realizing seamless splicing displaying for a perforated double-side backplane process.

Based on this, the embodiments of the present disclosure provide a display panel, a manufacturing method thereof, and a display apparatus. Technical solutions in embodiments of the present disclosure will be described clearly and completely below in conjunction with the drawings in the embodiments of the present disclosure. It is apparent that the embodiments described herein are only part of the embodiments of the present disclosure, not all the embodiments. Based on the embodiments in the present disclosure, all other embodiments obtained by those of ordinary skill in the art without creative work shall fall within the protection scope of the present disclosure.

Figure 1:
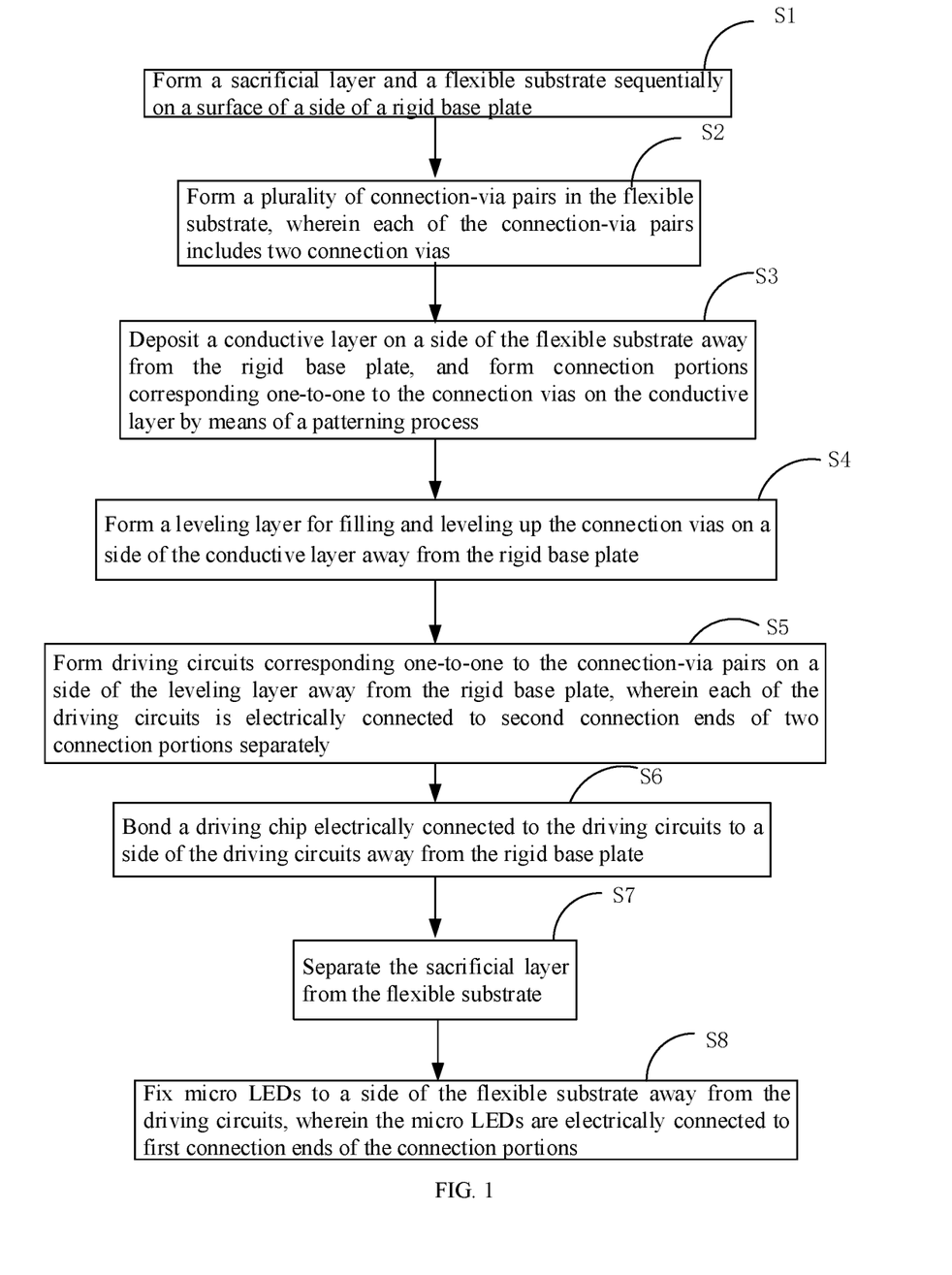
FIG. 1 is a flow diagram of a manufacturing method for a display panel provided by the embodiments of the present disclosure.

As shown in FIG. 1 to FIG. 21, the embodiments of the present disclosure provide a manufacturing method for a display panel. A basic principle of the manufacturing method is to prepare a driving backplane structure on one side of a flexible substrate at first, and then fix micro LEDs 17 on the other side of the flexible substrate to cause that the prepared display panel can realize full-pixel displaying on the surface (i.e., a display surface) provided with the micro LEDs, and related control structures may be arranged on a backplane side of the display panel. As shown in FIG. 1, the manufacturing method specifically includes the following steps.

Step S1: forming a sacrificial layer 2 and a flexible substrate 3 sequentially on a surface of a side of a rigid base plate 1.

Figure 4:
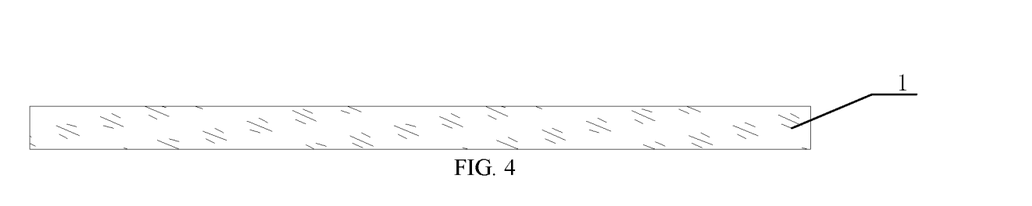
FIG. 4 to FIG. 20 are schematic structural diagrams obtained after each of the steps in a manufacturing method for a display panel provided by the embodiments of the present disclosure are executed.
Figure 5:
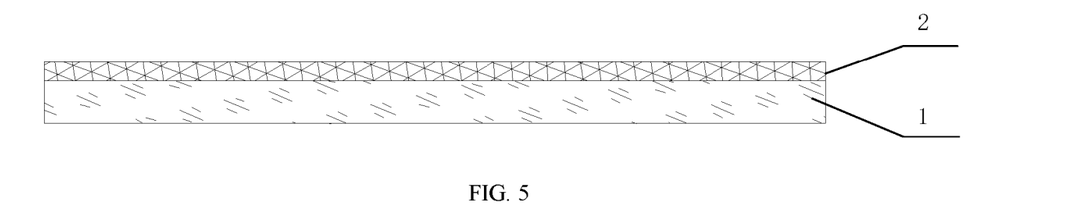
Figure 6:
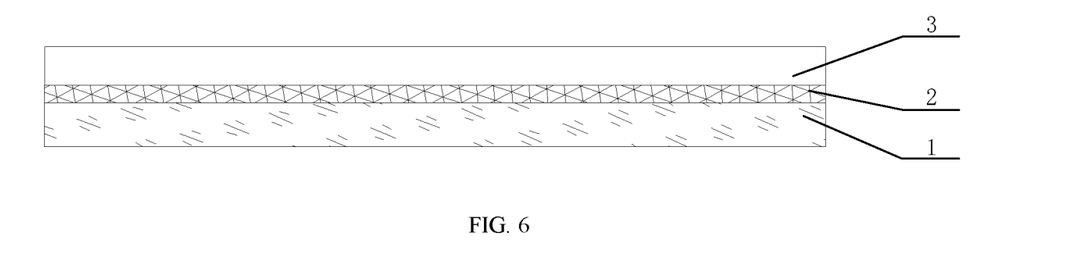

At the step S1, as shown in FIG. 4, the rigid base plate 1 has two opposite surfaces, and the side where the sacrificial layer 2 and the flexible substrate 3 are formed is set to be a first surface of the rigid base plate 1. At first, the sacrificial layer 2 is formed on the first surface of the rigid base plate 1 to obtain a structure as shown in FIG. 5, and the flexible substrate 3 is formed on a surface of the side of the sacrificial layer 2 away from the rigid base plate 1 to obtain a structure as shown in FIG. 6.

The manufacturing method provided by the embodiments of the present disclosure is improved based on the TGV technology. In the whole preparation process, the rigid base plate 1 is used as a carrier for manufacturing a driving backplane on one side of the display panel. The rigid base plate 1 needs to be removed when fixing of structures of micro LEDs 17 on the other side of the display panel. The flexible substrate 3 can provide a good protection effect for a subsequently prepared display device and even the whole display panel structure. The sacrificial layer 2 is arranged between the rigid base plate 1 and the flexible substrate 3, and the rigid base plate 1 can be peeled off by means of peeling the sacrificial layer 2 from the flexible substrate 3. Furthermore, the sacrificial layer 2 is only in contact with the flexible substrate 3 and first connection portions subsequently formed in connection vias of the flexible substrate 3, so that the sacrificial layer 2 can be separated from the flexible substrate 3 without laser lift-off operation to avoid the problem of metal fracturing caused by the laser lift-off operation, which ensures the flatness and cleanness of a surface of a side of the flexible substrate 3 facing the rigid base plate 1 after the peeling; and surface treatment is not needed, and the energy consumption is reduced.

Optionally, a material of the flexible substrate 3 here may be PI, i.e., a polyimide material.

Figure 7:
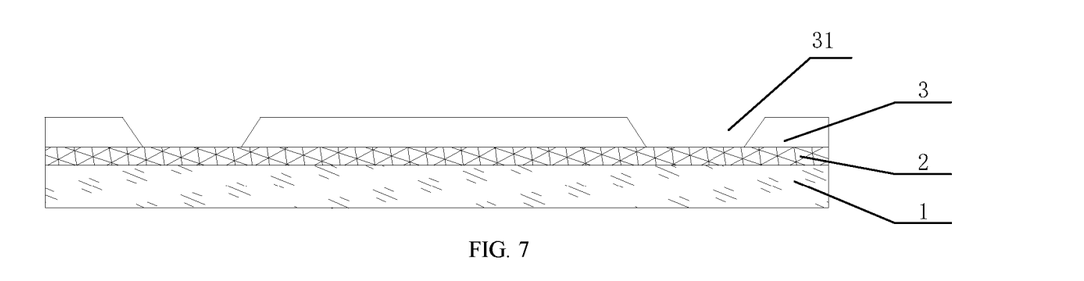

Step S2: forming a plurality of connection-via pairs in the flexible substrate 3, wherein each of the connection-via pairs includes two connection vias 31. The connection-via pairs correspond one-to-one to micro LEDs 17 to be bonded to obtain a structure as shown in FIG. 7.

At the step S2, the foregoing connection-via pairs formed in the flexible substrate 3 is used to connect and conduct the driving backplane on one side of the flexible substrate 3 and the micro LEDs 17 on the other side of the flexible substrate 3 when fixing the micro LEDs 17 on a side of the flexible substrate 3 away from the driving backplane. Each connection-via pair includes two connection vias 31 which respectively correspond to two electrodes of the corresponding micro LED 17 to facilitate that the micro LED 17 and a driving circuit realize circuit loop conduction by means of the two connection vias 31.

Optionally, the connection vias 31 here are formed by means of a dry etching process, that is, the dry etching process is performed on the flexible substrate 3 to form the plurality of connection-via pairs. As shown in FIG. 7, the connection vias 31 of the foregoing connection-via pairs penetrate through the flexible substrate 3 to cause portions, corresponding to the connection vias 31, of the sacrificial layer 2 to be exposed.

Figure 8:
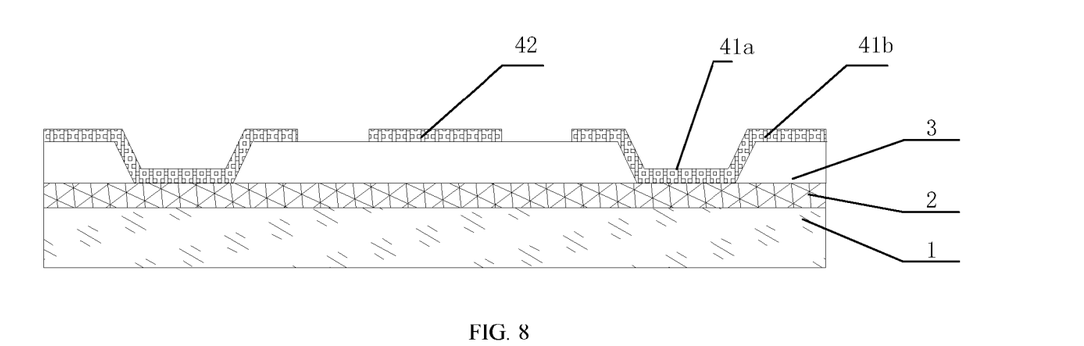

Step S3: depositing a conductive layer on a side of the flexible substrate 3 away from the rigid base plate 1, and forming connection portions 41 corresponding one-to-one to the connection vias 31 on the conductive layer by means of a patterning process. A pattern of each connection portion 41 includes a first connection end 41a located in the corresponding connection via 31, a second connection end 41b extending to a surface of a side of the flexible substrate 3, and a third connection end 41c located in the corresponding connection via 31; and a thickness of the first connection end 41a is less than a via depth of the connection via 31, the structure of which is as shown in FIG. 8.

At the step S3, a pattern of the conductive layer is formed on the side of the flexible substrate 3 away from the rigid base plate 1 by means of the patterning process according to a requirement. Specifically, the conductive layer includes the connection portions 41 corresponding one-to-one to the connection vias 31. For any connection via 31, the connection portion 41 corresponding thereto extends from the interior of the connection via 31 to the exterior of the connection via 31, i.e. a surface of the side of the flexible substrate 3 away from the rigid base plate 1, so that driving circuit structures finally bonded to the side of the flexible substrate 3 away from the rigid base plate 1 are connected to the micro LEDs 17 finally fixed to the side of the flexible substrate 3 away from the driving circuit structures to realize circuit conduction by means of the connection portions 41.

In addition, connection positions of the connection portions 41 with the driving circuits are different from connection positions of the connection portions 41 to the micro LEDs 17; and furthermore, the connection portions 41 are formed by means of depositing metal in the connection vias 31, and a deposition thickness is less than the via depth of the connection vias 31. Therefore, the metal of a layered structure is less affected by thermal expansion and cold contraction, and the risk of fracturing of a metal structure in high-temperature work can be effectively reduced.

Optionally, a material of the conductive layer may be copper or a copper alloy.

As an optional embodiment, at the step S3, the process of forming the patterns of the connection portions 41 by means of patterning the conductive layer may also include forming a light shield portion 42 (as shown in FIG. 8) in addition to forming the connection portions 41 used for connecting the circuits respectively on two opposite sides of the flexible substrate 3. The light shield portion 42 is formed on the surface of the flexible substrate 3, and corresponds to an active layer 7 of a top-gate type thin-film transistor. An orthographic projection of the active layer 7 on the flexible substrate 3 falls into an orthographic protection of the light shield portion 42 on the flexible substrate 3 to prevent light emitted by the micro LEDs 17 from irradiating the active layer 7 of the top-gate type thin-film transistor device and affecting the same.

Figure 9:
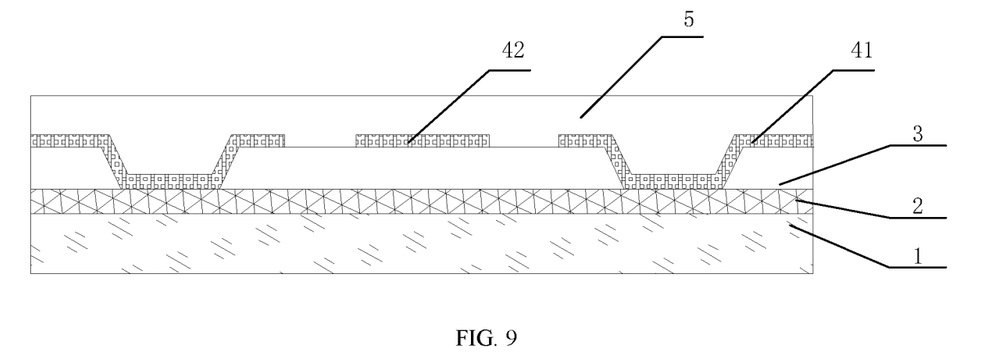

Step S4: forming a leveling layer 5 for filling and leveling up the connection vias 31 on a side of the conductive layer away from the rigid base plate 1 to obtain a structure as shown in FIG. 9.

Specifically, the leveling layer 5 is manufactured to keep the surface of the side of the flexible substrate 3 away from the rigid base plate 1 flat to facilitate subsequent manufacturing of the driving circuits. In addition, the leveling layer 5 is equivalent to increasing the thickness of the flexible substrate 3, and a material of the leveling layer may be the same polyimide as the flexible substrate 3, or may be other organic planarization materials, and no limitation will be made here.

It should be noted that after the leveling layer 5 is manufactured, during formation of the thin-film transistor of the driving circuit, a drain 12 of the thin-film transistor need to penetrate through the leveling layer 5 and then be in contact with the second connection end 41b of the connection portion 41.

Step S5: forming driving circuits corresponding one-to-one to the connection-via 31 pairs on a side of the leveling layer 5 away from the rigid base plate 1, wherein each of the driving circuits is electrically connected to second connection ends 41b of two connection portions 41 separately. Specifically; each driving circuit may include a thin-film transistor and an auxiliary trace, wherein the drain 12 of the thin-film transistor device is electrically connected to the second connection end 41b of one connection portion 41, and the auxiliary trace 13 is electrically connected to the second connection end 41b of other connection portion 41; and the auxiliary trace 13 is used for providing a constant voltage to one electrode of the micro LED 17, for example, the auxiliary trace can be grounded.

According to the manufacturing method provided by the present embodiment, the driving structures of the thin-film transistors are manufactured on the first side of the flexible substrate 3 at first: the micro LEDs 17 are then fixed to the second side of the flexible substrate 3. The driving circuit here may include the thin-film transistor and other driving structure(s) used for driving the micro LEDs. At the step S5, forming of the driving backplane on the side of the flexible substrate 3 away from the rigid base plate 1 is started. A connection relationship between the above-mentioned driving circuits and the connection portions 41 is the basis for final realization of conduction of the driving circuits and the micro LEDs 17.

Figure 10:
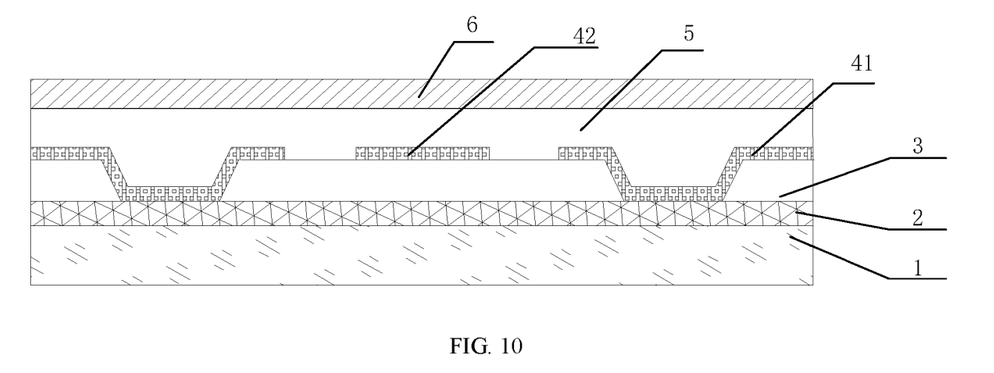
Figure 11:
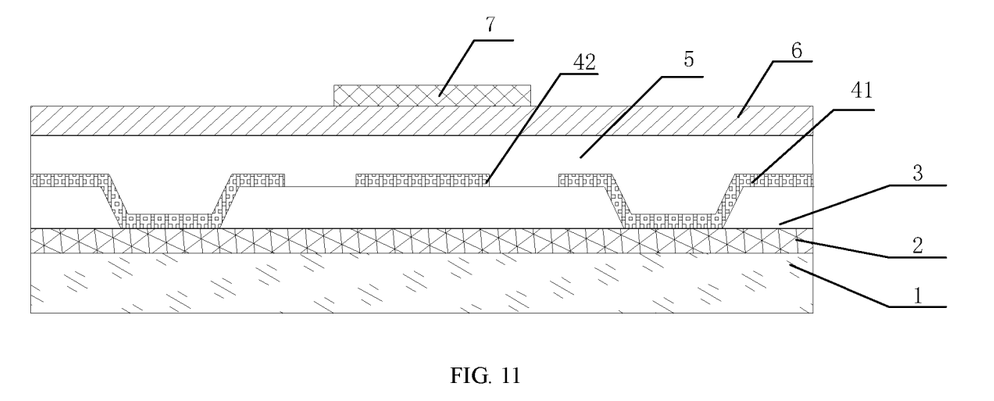
Figure 12:
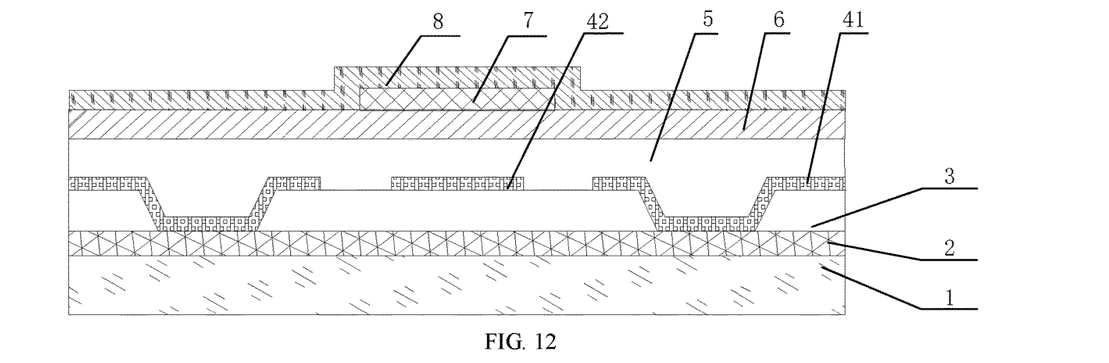
Figure 13:
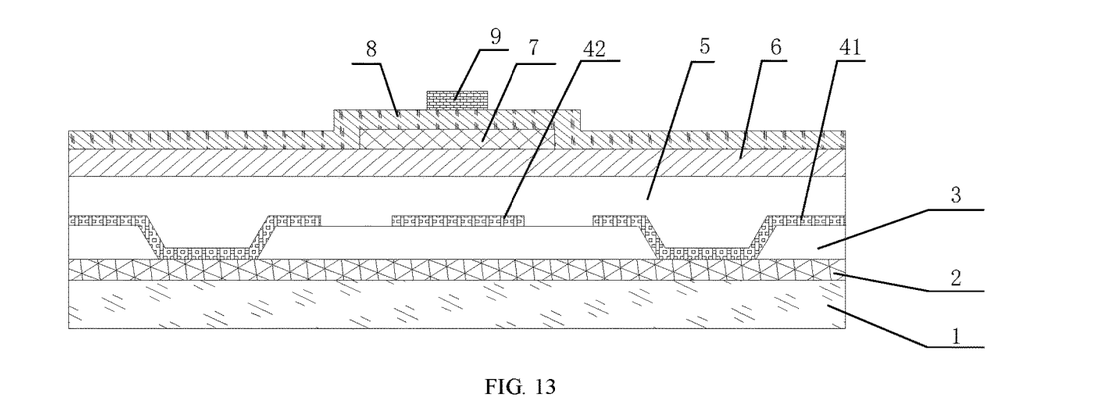
Figure 14:
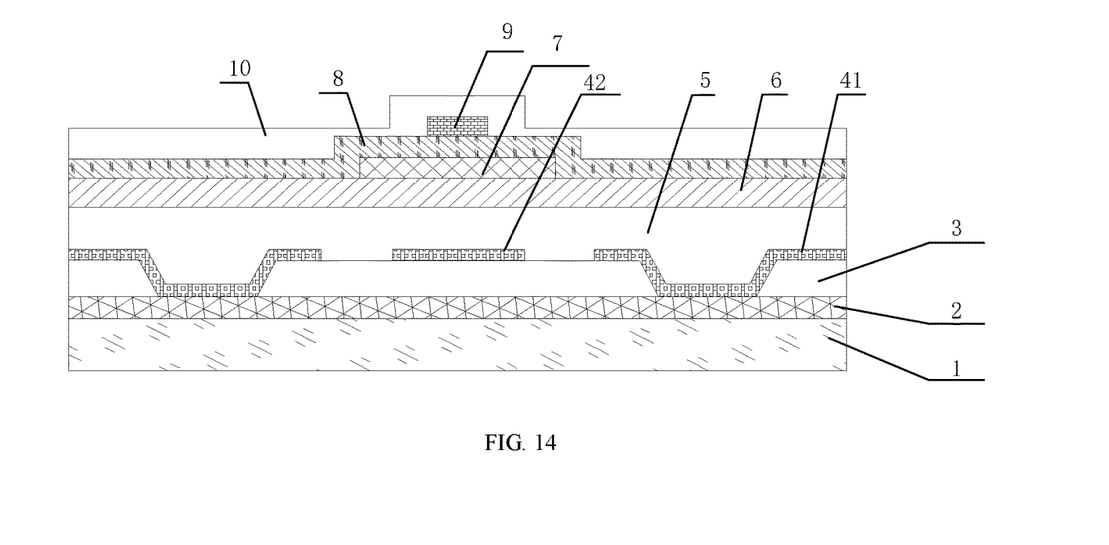
Figure 15:
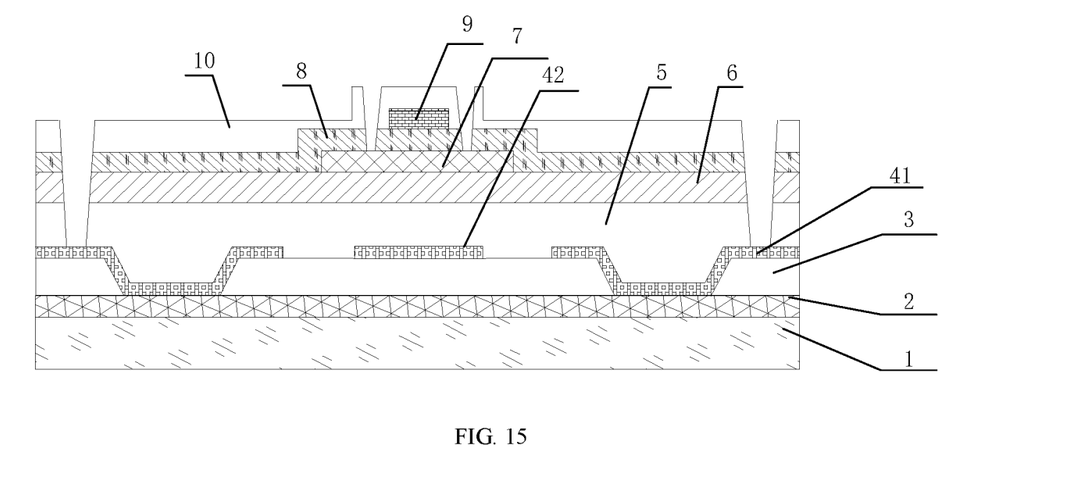
Figure 16:
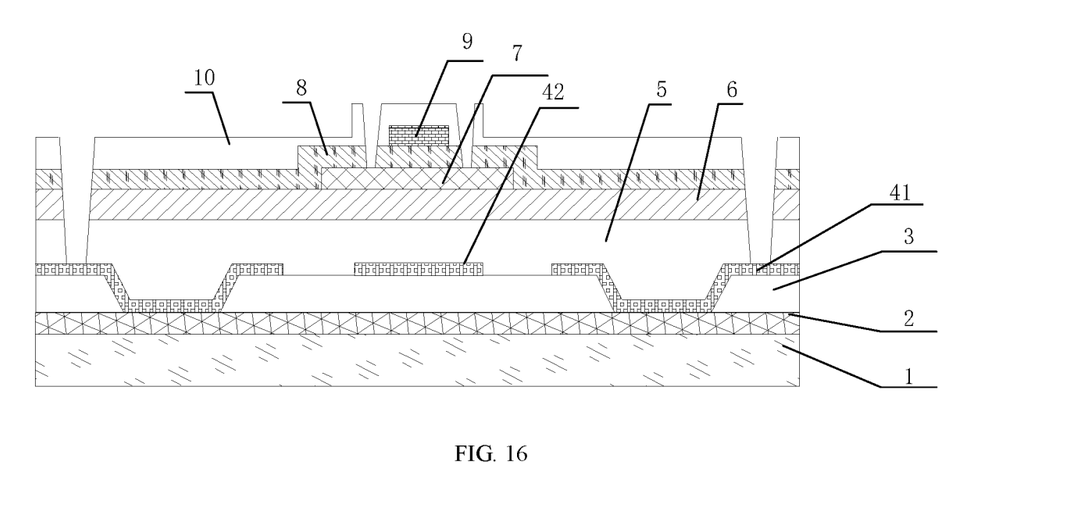

Specifically, a specific process of manufacturing the driving circuits is that: at first, a buffer layer 6 is formed on the leveling layer 5 to obtain a structure as shown in FIG. 10; then an active layer 7 is formed to obtain a structure as shown in FIG. 11, a gate insulation layer 8 is formed to obtain a structure as shown in FIG. 12, a gate 9 is formed to obtain a structure as shown in FIG. 13, and an interlayer dielectric layer 10 is formed to obtain a structure as shown in FIG. 14 in sequence: vias penetrating through the interlayer dielectric layer 10, the gate insulation layer 8, the buffer layer 6 and the leveling layer 5 are formed by means of the patterning process to obtain a structure as shown in FIG. 15: a source 11, a drain 12 and an auxiliary trace 13 are formed to obtain a structure as shown in FIG. 16; the drain 12 and the auxiliary trace 13 are electrically connected to the second connection ends 41b by means of the vias penetrating through the interlayer dielectric layer 10, respectively, the gate insulation layer 8, the buffer layer 6 and the leveling layer 5; and at this time, the manufacturing of the driving circuits is completed.

Step S6: bonding a driving chip 16 to a side of the driving circuits away from the rigid base plate 1, wherein the driving chips are electrically connected to the driving circuits by one-to-one manner.

Figure 2:
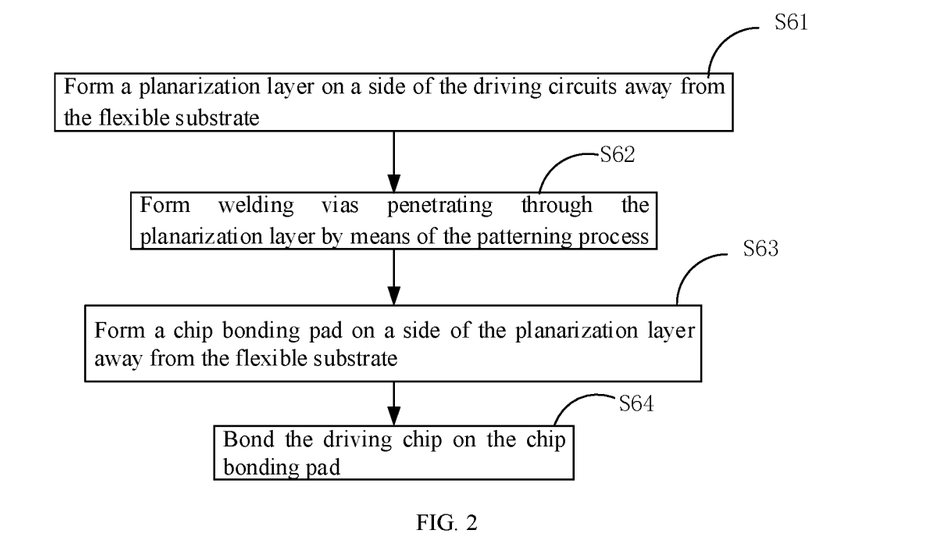
FIG. 2 is a flow diagram of bonding a driving chip in the manufacturing method for the display panel provided by the embodiments of the present disclosure.

At the step S6, the driving chip 16 is used for providing a driving force for work of the thin-film transistors, and can be specifically electrically connected to the sources 11 of the thin-film transistors. As shown in FIG. 2, the step S6 of bonding a driving chip 16 electrically connected to the driving circuits on a side of the driving circuits away from the rigid base plate 1 may specifically include the following steps.

Figure 17:
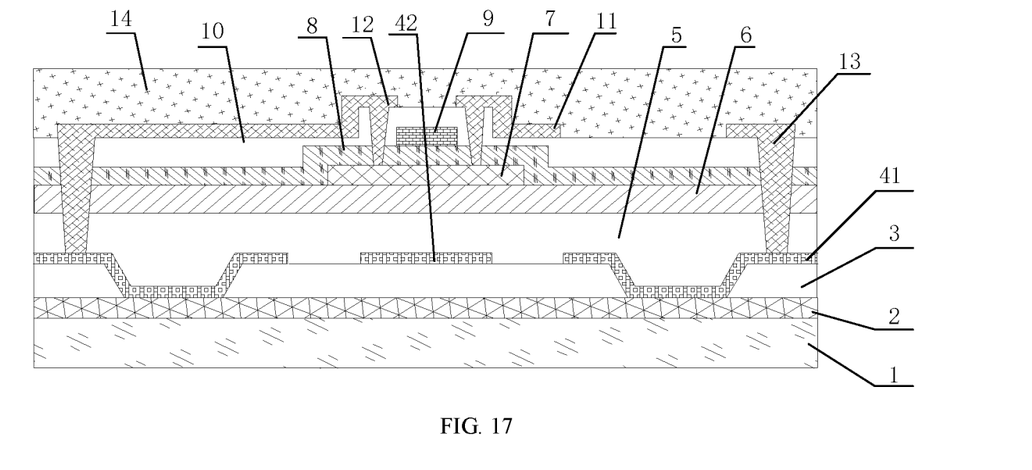

Step S61: forming a planarization layer 14 on a side of the driving circuits away from the flexible substrate 3 to obtain a structure as shown in FIG. 17, wherein the planarization layer 14 greatly improves the flatness of the surfaces of the driving circuits to facilitate subsequent arrangement of the driving chip 16.

Figure 18:
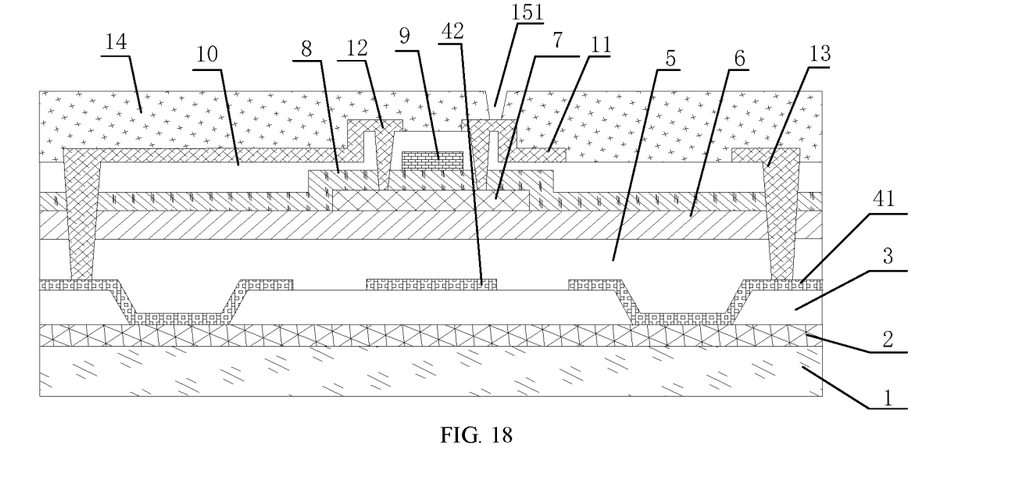

Step S62: forming welding vias 151 penetrating through the planarization layer 14 by means of the patterning process, wherein the welding vias 151 reach the sources 11 of the thin-film transistors from a surface of the planarization layer 14 to facilitate electric connection of the driving chip 16 to the sources 11 of the thin-film transistors by means of the welding vias 151. In the structure as shown in FIG. 18, the welding via 151 corresponds to the source 11 in position, and the driving chip 16 is electrically connected to the source 11 by means of the welding via 151.

Figure 19:
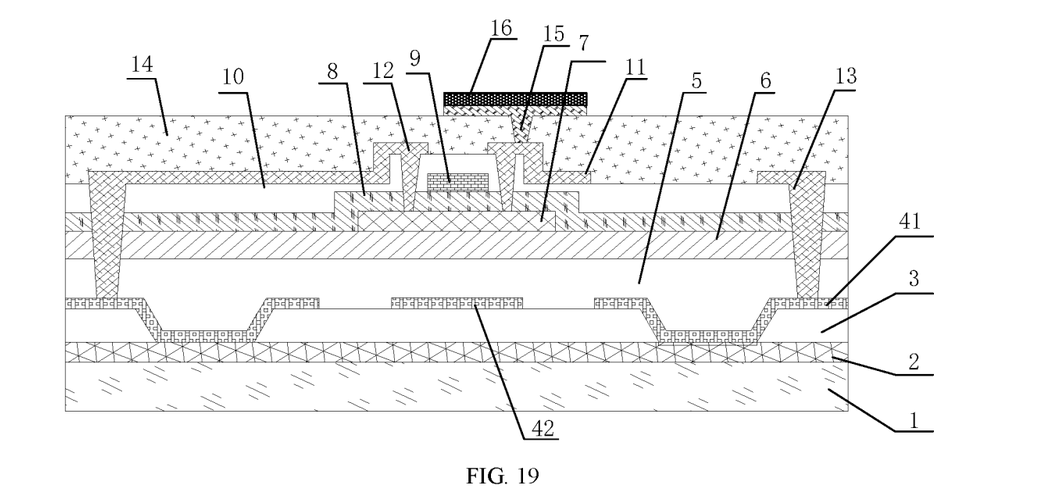

Step S63: forming a chip bonding pad 15 on a side of the planarization layer 14 away from the flexible substrate 3, wherein the chip bonding pad 15 is electrically connected to the source 11 by means of the welding via 151 to obtain a structure as shown in FIG. 19. The portion, located in the welding via 151, of the chip bonding pad 15 is connected to the source 11 of the thin-film transistor, and the other portion, located on the surface of the planarization layer 14, of the chip bonding pad 15 is used for arranging the driving chip 16.

Step S64: bonding the driving chip 16 on the chip bonding pad 15 to obtain a structure as shown in FIG. 19.

At this time, the manufacturing of the driving backplane is completed. The micro LEDs 17 need to be fixed on the second side of the flexible substrate 3 away from the driving backplane in the next step.

Figure 20:
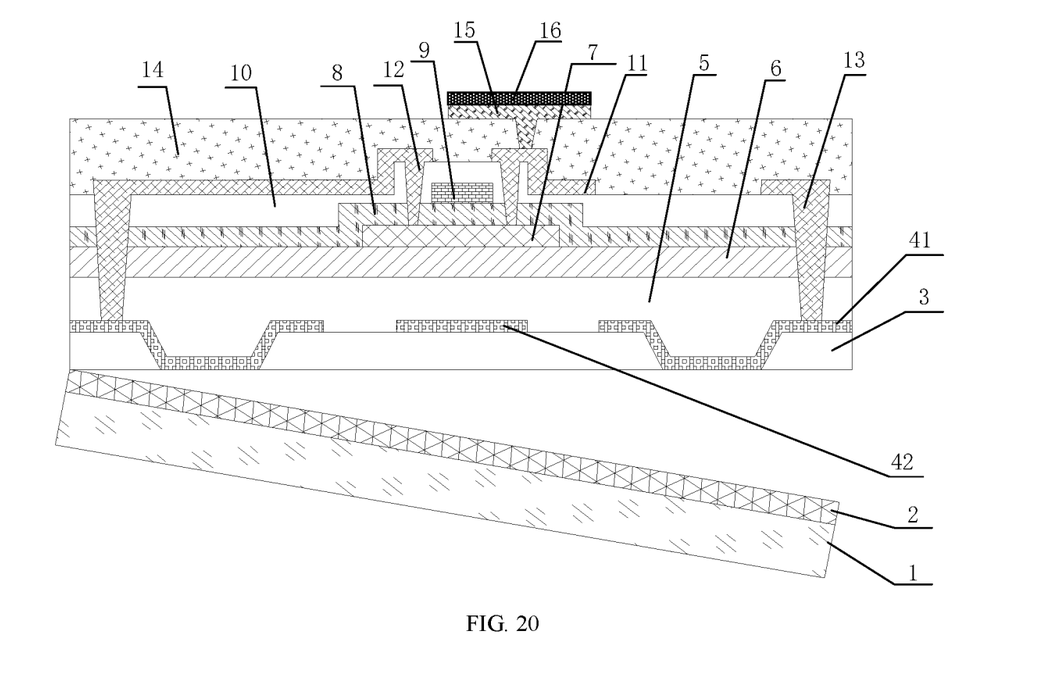

Step S7: separating the sacrificial layer 2 from the flexible substrate 3, as shown in FIG. 20.

At the step S7, the flexible substrate 3 and the sacrificial layer 2 are separated, thus peeling off the sacrificial layer 2 and the rigid base plate 1. At this time, the second side of the flexible substrate 3 away from the driving backplane is exposed, and the connection portions 41 deposited in the connection vias 31 are also exposed from the surface of the second side of the flexible substrate 3.

Figure 21:
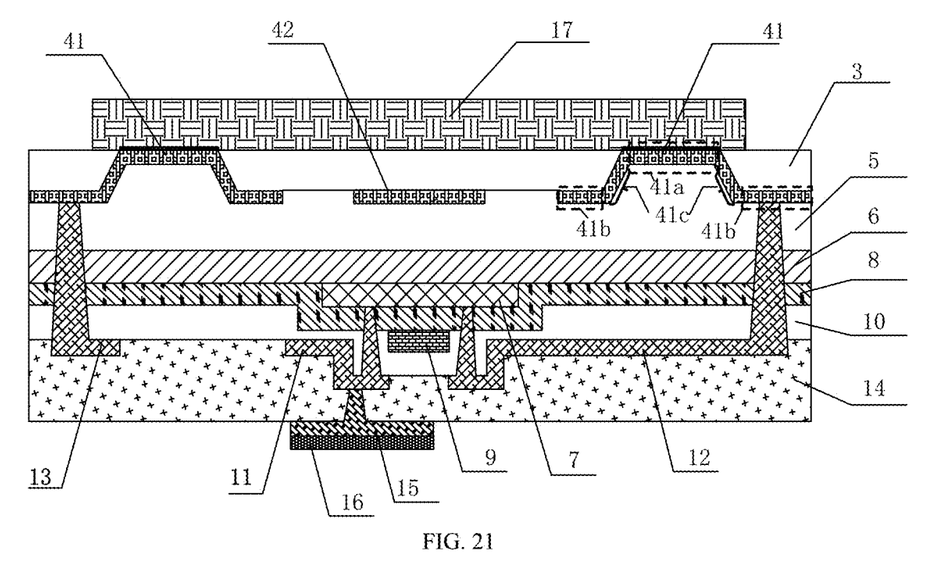
FIG. 21 is a structural schematic diagram of a display panel provided by the embodiments of the present disclosure.

Step S8: fixing micro LEDs 17 electrically connected to first connection ends of the connection portions 41 to a side of the flexible substrate 3 away from the driving circuits to obtain a structure as shown in FIG. 21.

At the step S8, the structure, as shown in FIG. 20, where the rigid base plate 1 and the sacrificial layer 2 are peeled off is flipped, and the micro LEDs 17 are directly fixed to the second side of the flexible substrate 3 away from the driving backplane. The micro LEDs 17 are in contact with the first connection ends 41a of the connection portions 41 exposed from the second side of the flexible substrate 3 away from the driving backplane. At this time, the micro LEDs 17 and the driving circuits respectively on two sides of the flexible substrate 3 realize circuit conduction.

Figure 3:
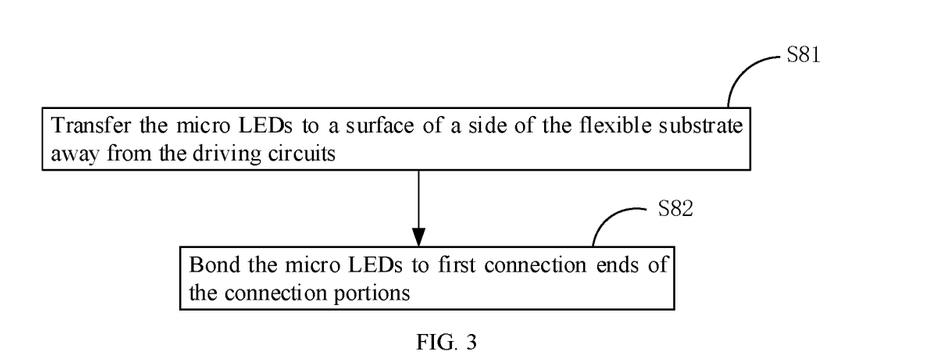
FIG. 3 is a flow diagram of fixing micro LEDs in the manufacturing method for the display panel provided by the embodiments of the present disclosure.

Specifically, as shown in FIG. 3, the step S8 of fixing micro LEDs 17 electrically connected to the first connection ends 41a of the connection portions 41 on the side of the flexible substrate 3 away from the driving circuits may specifically include the following steps.

Step S81: transferring the micro LEDs 17 to a surface of a side of the flexible substrate 3 away from the driving circuits, wherein the electrodes of the micro LEDs 17 need to be abutted with the first connection ends 41a of the connection portions 41.

Step S82: bonding the micro LEDs 17 to the first connection ends 41a of the connection portions 41.

By means of the above-mentioned steps, the fixing of the micro LEDs 17 is completed, and the manufacturing of the whole display panel is completed; and the finally obtained structure of the display panel is as shown in FIG. 21.

In conclusion, in the manufacturing method provided by the embodiments of the present disclosure, the flexible substrate 3 and the leveling layer 5 can support and protect the entire driving backplane structure: the connection-via 31 pairs arranged on the flexible substrate 3 connect the two sides of the flexible substrate 3: the driving circuits and the micro LEDs 17 realize the circuit conduction by means of the connection portions 41 in the connection vias 31; the connection portions 41 are less affected by thermal expansion and cold contraction; meanwhile, the flexible substrate 3 can further protect the connection portions 41 from temperature influence; and the presence of the sacrificial layer 2 avoids the possibility of metal fracturing generated during the laser lift-off process, facilitates manufacturing of double-sided backplanes for display panels, and is of great significance for narrow-bezel or bezel-free tiled displaying.

Based on the same inventive concept, the embodiments of the present disclosure further provide a display panel, as shown in FIG. 21. The display panel includes:
  a flexible substrate 3, wherein the flexible substrate 3 has a plurality of connection-via pairs, and each connection-via pair includes two connection vias 31;
  connection portions 41, located on a side of the flexible substrate 3 and corresponding one-to-one to the connection vias 31, wherein each connection portion 41 includes a first connection end 41a completely located in the corresponding connection via 31, a second connection end 41b on a surface (bottom surface) of a side of the flexible substrate 3, and a third connection end 41c completely located in the corresponding connection via 31; the second connection end 41b includes two parts, i.e., one part 41b on the left side of the corresponding connection via 31 and the other part 41b on the right side of the corresponding connection via 31; the first connection end 41a is connected to the second connection end 41b through the third connection end 41c; orthographic projections of the first connection end 41a, the second connection end 41b, and the third connection end 41c on the flexible substrate 3 do not overlap with each other, the third connection end 41c cover a side wall of the flexible substrate 3 forming the corresponding connection via 31, the first connection end 41a does not overlap with the side wall of the flexible substrate 3 forming the corresponding connection via 31, a surface (top surface) of the first connection end 41a facing away from the second connection end 41b is flush with a surface (top surface) of the flexible substrate 3 facing away from the second connection end 41b, and a thickness of the first connection end 41a is less than a via depth of the corresponding connection via 31;
  a leveling layer 5, located on a side of the connection portions 41 away from the flexible substrate 3, specifically, a material of the leveling layer 5 may be the same as a material of the flexible substrate 3;
  driving circuits, located on a side of the leveling layer 5 away from the flexible substrate 3 and corresponding one-to-one to the connection-via 31 pairs, wherein each driving circuit is electrically connected to second connection ends 41b of two of connection portions 41 separately;
  a driving chip 16, located on a side of the driving circuits away from the flexible substrate 3, wherein the driving chip 16 is connected to the driving circuits;
  micro LEDs 17, located on a side of the flexible substrate 3 away from the driving circuits and corresponding one-to-one to the connection-via 31 pairs, wherein each micro LED 7 is electrically connected to the first connection ends 41a of the two of the connection portions 41 separately.

Optionally, in the display panel provided by the embodiments of the present disclosure, as shown in FIG. 21, the driving circuit may specifically include a thin-film transistor and an auxiliary trace 13: a drain 12 of the thin-film transistor is electrically connected to the second connection end 41b of one of the two of the connection portion 41, and a source 11 of the thin-film transistor is electrically connected to the driving chip 16; and the auxiliary trace 13 is electrically connected to the second connection end 41b of the other of the two of the connection portions 41.

Optionally, in the display panel provided by the embodiments of the present disclosure, as shown in FIG. 21, the thin-film transistor may specifically include: a buffer layer 6, an active layer 7, a gate insulation layer 8, a gate 9, an interlayer dielectric layer 10, the source 11 and the drain 12 which are stacked sequentially on the side of the leveling layer 5 away from the flexible substrate 3; and the source 11, the drain 12 and the auxiliary trace 13 belong to the same film layer: the drain 12 is electrically connected to the second connection ends 41b of one of the two of the connection portions respectively by means of vias penetrating through the interlayer dielectric layers 10, the gate insulation layers 8, the buffer layers 6 and the leveling layer 5, and the auxiliary trace 13 is electrically connected to the second connection ends 41b of the other of the two of the connection portions respectively by means of vias penetrating through the interlayer dielectric layers 10, the gate insulation layers 8, the buffer layers 6 and the leveling layer 5.

Optionally, in the display panel provided by the embodiments of the present disclosure, as shown in FIG. 21, the display panel may further include: a planarization layer 14 located between the driving circuits and the driving chip 16, and a chip bonding pad 15 located between the driving circuits and the planarization layer 14: wherein the chip bonding pad 15 is connected to the source 11 by means of the welding via 151 penetrating through the planarization layer 14, and the chip bonding pad 15 is connected to the driving chip 16 and the source 11, respectively. Optionally, in the display panel provided by the embodiments of the present disclosure, as shown in FIG. 21, the display panel may further include: a light shield portion 42 arranged on the same film layer as the connection portions 41: the light shield portion 42 corresponds to the active layer 7 of the thin-film transistor device; and an orthographic projection of the active layer 7 on the flexible substrate 3 falls into an orthographic projection of the light shield portion 42 on the flexible substrate 3. The light shield portion 42 and the connection portions 41 are simultaneously formed by patterning after a conductive layer is deposited on a first side of the flexible substrate 3, and are used for protecting the active layer 7 from being irradiated by the micro LEDs 17.

Specifically, the display panel provided by the embodiments of the present disclosure is manufactured through the manufacturing method, the flexible substrate 3 and the leveling layer 5 in the structure can protect the entire backplane structure: the connection-via 31 pairs formed in the flexible substrate 3 connect the two sides of the flexible substrate 3: the driving circuits and the micro LEDs 17 realize the circuit conduction by means of the connection portions 41 in the connection vias 31: the connection portions 41 are less affected by thermal expansion and cold contraction: meanwhile, the flexible substrate 3 can further protect the connection portions 41 from temperature influence; and the presence of the sacrificial layer 2 avoids the possibility of metal fracturing generated in the laser lift-off process, facilitates manufacturing of double-sided backplanes for display panels, and is of great significance for narrow-bezel or bezel-free tiled displaying.

Figure 22:
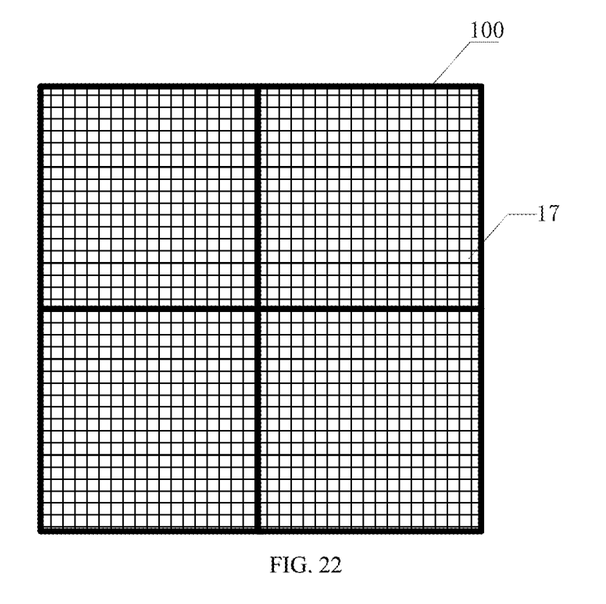
FIG. 22 is a schematic structural diagram of a display device provided by the embodiments of the present disclosure.

Based on the same inventive concept, the embodiments of the present disclosure further provide a display device, as shown in FIG. 22, including a plurality of the above display panels 100 which are mutually spliced and provided by the embodiments of the present disclosure, and seamless tiled displaying can be realized.

Obviously, those skilled in the art can make various changes and modifications to the embodiments of the present disclosure without departing from the spirit and scope of the present disclosure. Therefore, if these changes and modifications of the present disclosure fall within the scope of the claims of the present disclosure and equivalent technologies of the present disclosure, the present disclosure is intended to include these changes and modifications.

What is claimed is:

1. A display panel, comprising:
a flexible substrate, comprising a plurality of connection-via pairs, wherein each of the connection-via pairs comprises two connection vias each penetrating through the flexible substrate;
connection portions, located on a side of the flexible substrate and corresponding one-to-one to the connection vias, wherein each of the connection portions comprises:
a first connection end completely in the corresponding connection via;
a second connection end on a surface of a side of the flexible substrate: wherein the second connection end comprises two parts on both sides of the corresponding connection via; and
a third connection end completely in the corresponding connection via;
wherein the first connection end connects to the second connection end through the third connection end, orthographic projections of the first connection end, the second connection end, and the third connection end on the flexible substrate do not overlap with each other, the third connection end cover a side wall of the flexible substrate forming the corresponding connection via, the first connection end does not overlap with the side wall of the flexible substrate forming the corresponding connection via, a thickness of the first connection end is less than a via depth of the corresponding connection via in the flexible substrate, and a surface of the first connection end facing away from the second connection end is flush with a surface of the flexible substrate facing away from the second connection end:
a leveling layer, located on a side of the connection portions away from the flexible substrate;
driving circuits, located on a side of the leveling layer away from the flexible substrate and corresponding one-to-one to the connection-via pairs, wherein each of the driving circuits is electrically connected to second connection ends of two of the connection portions separately;
a driving chip, located on a side of the driving circuits away from the flexible substrate, wherein the driving chip is electrically connected to the driving circuit; and
micro light emitting diodes (LEDs), located on a side of the flexible substrate away from the driving circuits and corresponding one-to-one to the connection-via pairs, wherein each of the micro LEDs is electrically connected to first connection ends of two of the connection portions separately.

2. The display panel according to claim 1, wherein the driving circuit comprises a thin-film transistor and an auxiliary trace:
a drain of the thin-film transistor is electrically connected to the second connection end of one of the two of the connection portions, and a source of the thin-film transistor is electrically connected to the driving chip; and
the auxiliary trace is electrically connected to the second connection end of the other of the two of the connection portions.

3. The display panel according to claim 2, wherein the thin-film transistor comprises: a buffer layer, an active layer, a gate insulation layer, a gate, an interlayer dielectric layer, the source and the drain which are stacked sequentially on the side of the leveling layer away from the flexible substrate; and
the source, the drain and the auxiliary trace belong to the same film layer: the drain is electrically connected to the second connection end of one of the two of the connection portions by means of vias penetrating through the interlayer dielectric layer, the gate insulation layer, the buffer layer and the leveling layer, and the auxiliary trace is electrically connected to the second connection end of one of the other of the connection portions by means of vias penetrating through the interlayer dielectric layer, the gate insulation layer, the buffer layer and the leveling layer.

4. The display panel according to claim 2, further comprising: a planarization layer located between the driving circuits and the driving chip and a chip bonding pad located between the driving chip and the planarization layer:
wherein the chip bonding pad is connected to the source by means of a welding via penetrating through the planarization layer, and the chip bonding pad is connected to the driving chip and the source, respectively.

5. The display panel according to claim 3, further comprising: a light shield portion arranged on the same film layer as the connection portions; and an orthographic projection of the active layer on the flexible substrate falls into an orthographic projection of the light shield portion on the flexible substrate.

6. The display panel according to claim 1, wherein a material of the leveling layer is the same as a material of the flexible substrate.

7. A manufacturing method for the display panel according to claim 1, comprising:
   forming a sacrificial layer and the flexible substrate sequentially on a surface of a side of a rigid base plate;
   forming the plurality of connection-via pairs in the flexible substrate;
   depositing a conductive layer on a side of the flexible substrate away from the rigid base plate, and forming the connection portions corresponding one-to-one to the connection vias on the conductive layer by means of a patterning process;
   forming the leveling layer for filling and leveling up the connection vias on a side of the conductive layer away from the rigid base plate;
   forming the driving circuits corresponding one-to-one to the connection-via pairs on a side of the leveling layer away from the rigid base plate;
   bonding the driving chip electrically connected to the driving circuits on a side of the driving circuits away from the rigid base plate;
   separating the sacrificial layer from the flexible substrate; and
   fixing the micro LEDs electrically connected to first connection ends of the connection portions on the side of the flexible substrate away from the driving circuits.

8. The manufacturing method according to claim 7, wherein the forming the driving circuits corresponding one-to-one to the connection-via pairs on the side of the leveling layer away from the rigid base plate comprises:
   stacking a buffer layer, an active layer, a gate insulation layer, a gate and an interlayer dielectric layer sequentially on a side of the leveling layer away from the flexible substrate;
   forming vias penetrating through the interlayer dielectric layer, the gate insulation layer, the buffer layer and the leveling layer by means of a patterning process; and
   forming sources, drains and auxiliary traces on a side of the interlayer dielectric layer away from the flexible substrate, wherein the drains and the auxiliary traces is electrically connected to second connection ends respectively by means of the vias penetrating through the interlayer dielectric layer, the gate insulation layer, the buffer layer and the leveling layer.

9. The manufacturing method according to claim 8, wherein the bonding the driving chip electrically connected to the driving circuits on the side of the driving circuits away from the rigid base plate comprises:
   forming a planarization layer on a side of the driving circuits away from the flexible substrate, and forming welding vias penetrating through the planarization layer by means of a patterning process;
   forming a chip bonding pad on a side of the planarization layer away from the flexible substrate, wherein the chip bonding pad is electrically connected to the sources by means of the welding vias; and
   bonding the driving chip on the chip bonding pad.

10. The manufacturing method according to claim 8, further comprising:
    forming a light shield portion of which an orthographic projection on the flexible substrate covers the active layer to be formed, while connection portions corresponding one-to-one to the connection vias are formed on the conductive layer by means of the patterning process.

11. The manufacturing method according to claim 7, wherein the fixing the micro LEDs electrically connected to the first connection ends of the connection portions on the side of the flexible substrate away from the driving circuits comprises:
    transferring the micro LEDs to a surface of the side of the flexible substrate away from the driving circuits; and
    bonding the micro LEDs to the first connection ends of the connection portions.

12. The manufacturing method according to claim 7, wherein the forming the leveling layer for filling and leveling up the connection vias on the side of the conductive layer away from the rigid base plate comprises:
    forming the leveling layer for filling and leveling up the connection vias on the side of the conductive layer away from the rigid base plate by using a material which is the same as a material of the flexible substrate.

13. A display device, comprising a plurality of the display panels, which are mutually spliced, according to claim 1.

14. The display panel according to claim 1, wherein an extension direction of the first connection end is parallel to an extension direction of the second connection end.

15. The display panel according to claim 1, wherein a plane where one of the two parts of the second connection end is located is parallel to a plane where the other one of the two parts of the second connection end is located.

16. The display panel according to claim 1, wherein the first connection end comprises a first surface and a second surface which are both parallel to the flexible substrate.

17. The display panel according to claim 16, wherein each of the two parts of the second connection end comprises a third surface and a fourth surface which are both parallel to the flexible substrate.

18. The display panel according to claim 16, wherein the first surface is the surface of the first connection end facing away from the second connection end and is flush with the surface of the flexible substrate facing away from the second connection end.

19. The display panel according to claim 18, wherein the first surface is bonded to the micro LEDs.

20. The display panel according to claim 17, wherein the third surface is in contact with the flexible substrate, and the fourth surface is connected to the driving circuits; and the fourth surface is a surface of the second connection end facing away from the first connection end.

* * * * *